United States Patent
Liu et al.

(10) Patent No.: US 7,297,598 B2
(45) Date of Patent: Nov. 20, 2007

(54) PROCESS FOR ERASE IMPROVEMENT IN A NON-VOLATILE MEMORY DEVICE

(75) Inventors: Shih-Chang Liu, Kaohsiung County (TW); Chi-Hsin Lo, Jhubei (TW); Shih-Chi Fu, Taipei (TW); Chia-Ta Hsieh, Tainan (TW); Wen-Ting Chu, Kaohsiung County (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 246 days.

(21) Appl. No.: 11/045,850

(22) Filed: Jan. 28, 2005

(65) Prior Publication Data

US 2006/0170029 A1    Aug. 3, 2006

(51) Int. Cl.
*H01L 21/8247*    (2006.01)

(52) U.S. Cl. .................. 438/266; 438/257; 438/265; 257/298; 257/315; 257/E21.682; 257/E21.689

(58) Field of Classification Search .............. 438/257, 438/266; 257/298, 682

See application file for complete search history.

(56) References Cited

U.S. PATENT DOCUMENTS

| | | | |
|---|---|---|---|
| 6,297,099 B1* | 10/2001 | Hsieh et al. ................ | 438/266 |
| 6,563,168 B2* | 5/2003 | Lee ........................... | 257/316 |
| 2005/0009358 A1* | 1/2005 | Choi et al. ................. | 438/706 |

* cited by examiner

*Primary Examiner*—Andy Huynh
*Assistant Examiner*—Dao H. Nguyen
(74) *Attorney, Agent, or Firm*—Haynes and Boone, LLP (57) ABSTRACT

A method of making embedded non-volatile memory devices includes forming a first mask layer overlying a polycrystalline silicon layer in a cell region and a peripheral region on a semiconductor substrate wherein the first mask layer has a plurality of openings in the cell region. Portions of the polycrystalline silicon layer exposed in the plurality of openings can be oxidized to form a plurality of poly-oxide regions, and the first mask layer can then be removed. The polycrystalline silicon layer not covered by the plurality of poly-oxide regions can be etched to form a plurality of floating gates, wherein etching the polycrystalline silicon layer is accompanied by a sputtering. A dielectric layer can then be formed, as well as a second mask layer in both the cell region and the peripheral region. The second mask layer in the cell region is partially etched back after a photoresist layer is formed over the second mask layer in the peripheral region. The dielectric layer is partially etched to form multiple thicknesses of the dielectric layer. The second mask layer is removed and a plurality of control gates are formed partially overlying the plurality of floating gates in the cell region.

11 Claims, 12 Drawing Sheets

PROCESS FOR ERASE IMPROVEMENT IN A NON-VOLATILE MEMORY DEVICE

BACKGROUND

When fabricating a non-volatile memory (NVM) cell having a split gate feature in a semiconductor wafer, erasing efficiency is associated with the thickness of an inter-poly oxide interposed between a floating gate and a control gate. An etching-back process could reduce the thickness of the inter-poly oxide at a tip of the floating gate but may damage gate dielectric layers in the peripheral regions, such as transistor regions. Furthermore, a process of etching polycrystalline silicon to form the floating gate may form an undercut in the floating gate such that a portion of a poly-oxide cap hangs over the undercut.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to a microelectronic device and, more specifically, to a non-volatile memory device.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 1:
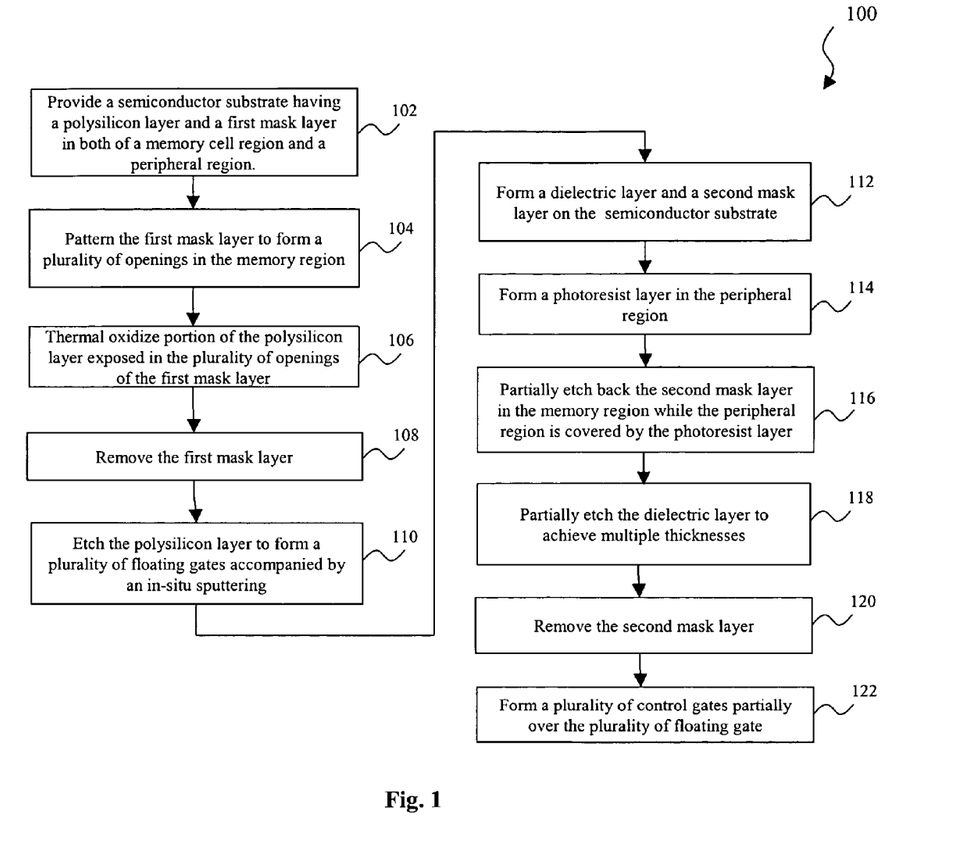
FIG. 1 is a simplified flowchart of one embodiment of a method to form non-volatile memory devices.

Referring to FIG. 1, illustrated is a simplified flowchart of a method 100 to form a semiconductor devices 200. With additional reference to FIGS. 2 to 12 as sectional views of the semiconductor device 200 during fabrication, the semiconductor device 200 and the method 100 to make the same are described below.

Figure 2:
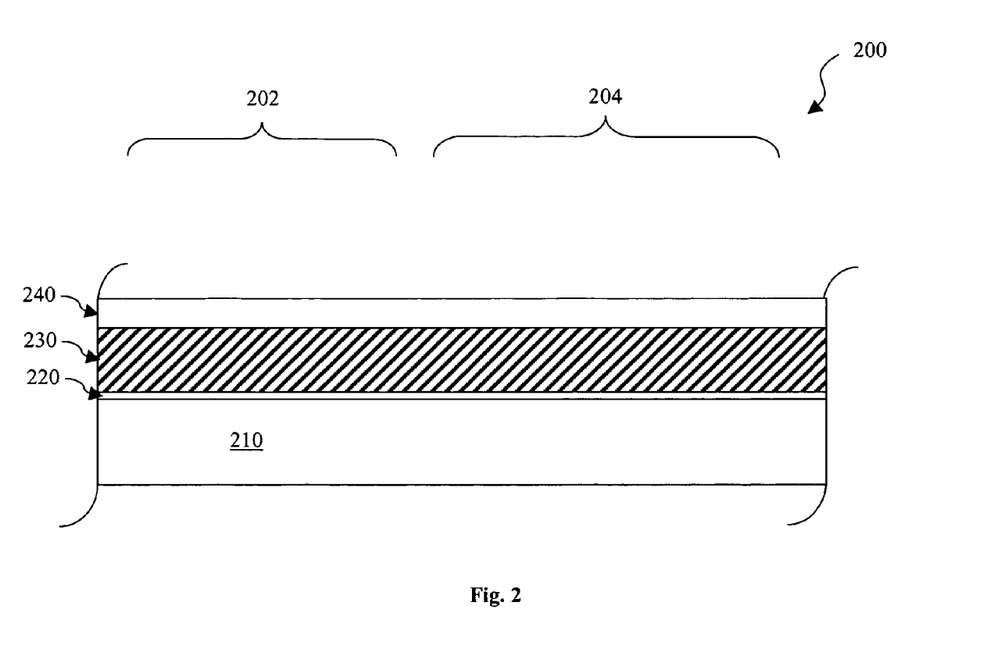
FIGS. 2 to 12 are sectional views of exemplary embodiments of the non-volatile memory devices during fabrication.

Referring to FIGS. 1 and 2, the method 100 begins at step 102 by providing a semiconductor substrate (substrate) 210. The substrate 210 may include an elementary semiconductor such as silicon, germanium, and/or diamond. The substrate 210 may also include a compound semiconductor such as silicon carbide, gallium arsenic, indium arsenide, and/or indium phosphide. The substrate 210 may include an alloy semiconductor such as silicon germanium, silicon germanium carbide, gallium arsenic phosphide, and/or gallium indium phosphide. The substrate 210 may include an epitaxial layer. For example, the substrate 210 may have an epitaxial layer overlying a bulk semiconductor. Further, the substrate 210 may be strained for performance enhancement. For example, the epitaxial layer may comprise semiconductor materials different from those of the bulk semiconductor such as a layer of silicon germanium overlying a bulk silicon, or a layer of silicon overlying a bulk silicon germanium formed by a process including selective epitaxial growth (SEG). Furthermore, the substrate 210 may comprise a semiconductor-on-insulator (SOI) structure. For examples, the substrate may include a buried oxide (BOX) layer formed by a process such as separation by implanted oxygen (SIMOX).

The substrate 210 may comprise an isolation feature to separate different devices formed on the substrate. The isolation feature may comprise different structure and can be formed using different processing technologies. For example, the isolation feature may comprise dielectric isolation including local oxidation of silicon (LOCOS) and shallow trench isolation (STI), junction isolation, field isolation, and/or other suitable isolation structure. The substrate 210 may also comprise various doping features such as a well, a source, a drain, and/or other doping features. The various doping regions may be accomplished by ion implantation and/or diffusion.

The semiconductor device 200 may include a peripheral region 202 and a memory cell (cell) region 204. The memory cell region 204 may comprise a plurality of non-volatile memory (NVM) cells. The NVM cells may have a split-gate structure, stacked-gate structure, other proper structure, and/or combinations thereof. The peripheral region 202 may comprise a variety of other microelectronic devices formed in the same substrate including passive components such a resistor, an inductor, and a capacitor and active components such as NPN bipolar transistors, PNP bipolar transistor, complementary bipolar transistor, diode, NMOS, PMOS, complementary MOS (CMOS), or other devices.

The semiconductor device 200 further comprises a dielectric layer 220. The dielectric layer 220 may comprise silicon oxide, silicon oxynitride, and high dielectric-constant (or "high-k", the term high is compared to a reference material such as silicon oxide) material formed by thermal oxidation, atomic layer deposition (ALD), chemical vapor deposition (CVD), or physical vapor deposition (PVD). The dielectric layer 220 may have a multi-layer structure, such as a first layer of silicon oxide formed by thermal oxidation, and then a layer of high K material formed by ALD. The high K material may comprise metal oxides, metal nitrides, metal silicates, transition metal-oxides, transition metal-nitrides, transition metal-silicates, metal oxynitrides, metal aluminates, zirconium silicate, zirconium aluminates, and combinations thereof.

The semiconductor device 200 further comprises a polycrystalline silicon (polysilicon or poly-Si) layer 230. The poly-Si layer 230 may be formed by CVD, PVD, and/or other suitable method. The poly-Si layer 200 further comprises or is replaced by other conductive material such as metal and/or metal silicide formed by CVD, PVD, silicidation, plating, and/or ALD. The poly-Si layer 230 may involve more processes during formation such as ion implant doping.

The semiconductor device 200 further comprises a hard mask layer 240 (or first mask layer). The hard mask layer 240 may comprise silicon nitride, silicon oxynitride, silicon carbide, and/or other suitable dielectric materials and may be formed by a method such as CVD or PVD.

Figure 3:
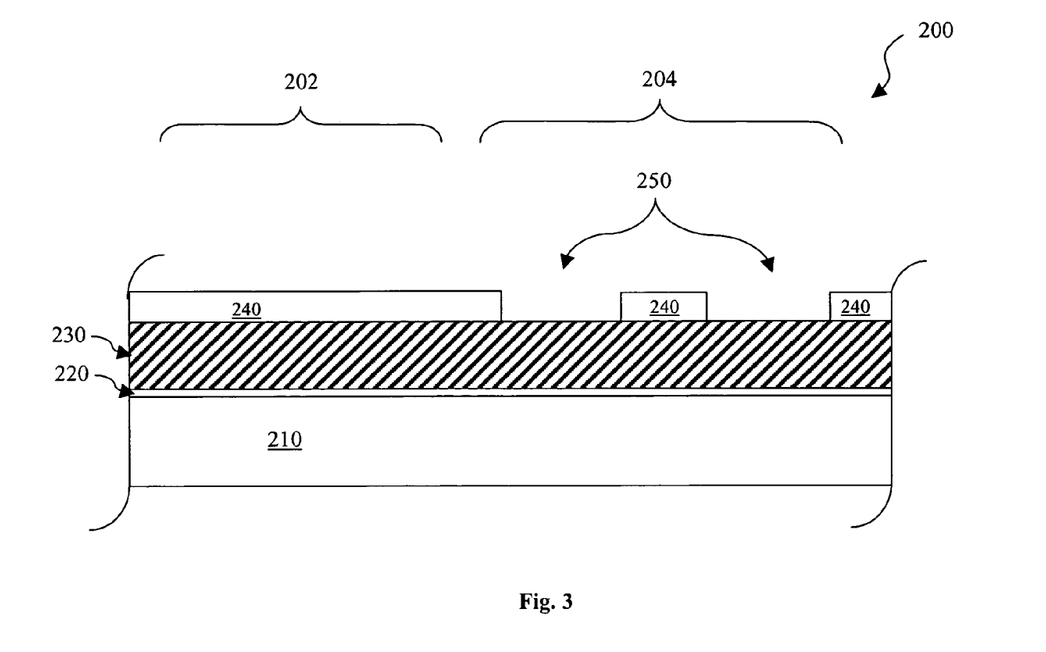

Referring to FIGS. 1 and 3, the method 100 proceeds to step 104 in which the hard mask layer 240 is patterned to form a plurality of openings, each defined for a NVM cell 250 in the cell region 204. The hard mask layer 240 is patterned with a suitable process such as photolithography processing and etching. In this example, etching is performed to transfer the pattern defined by a photomask to the hard mask layer 240. The photolithography processing used in this example and various other steps may include photoresist coating, soft baking, mask aligning, exposing pattern, post-exposure baking, developing photoresist, hard baking, and stripping after the etching. Photolithography patterning may also be achieved or replaced by other proper methods such as maskless photolithography, electron-beam writing, ion-beam writing, optical writing, and molecular imprint. The etching process may include wet etch, dry etch, reactive ion etch (RIE), and other suitable processing. For example, the hard mask layer 240 of silicon nitride may be removed by phosphoric acid. A cleaning process may be followed thereafter.

Figure 4:
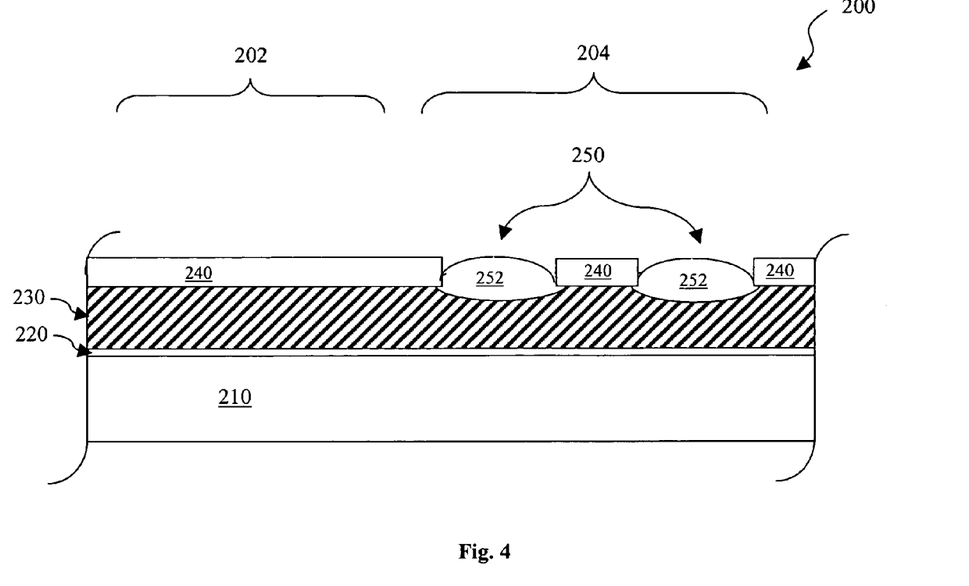

Referring to FIGS. 1 and 4, the method 100 proceeds to step 106 in which portion of the poly-Si layer 230 exposed in the plurality of openings are oxidized to form a plurality of poly-oxide regions 252. The polysilicon oxidation may be achieved by performing dry oxidation, wet oxidation, or steam oxidation. The oxidation may be implemented in an environment having a temperature raging from about 800° C. to about 1200° C. The oxidation duration may depend on the oxidation temperature and expected thickness in a range between 10 minutes and 200 minutes. The plurality of poly-oxide regions 252 may have a convex surface and have a thickness at center ranging from about 1000 angstrom to about 2000 angstrom.

Figure 5:
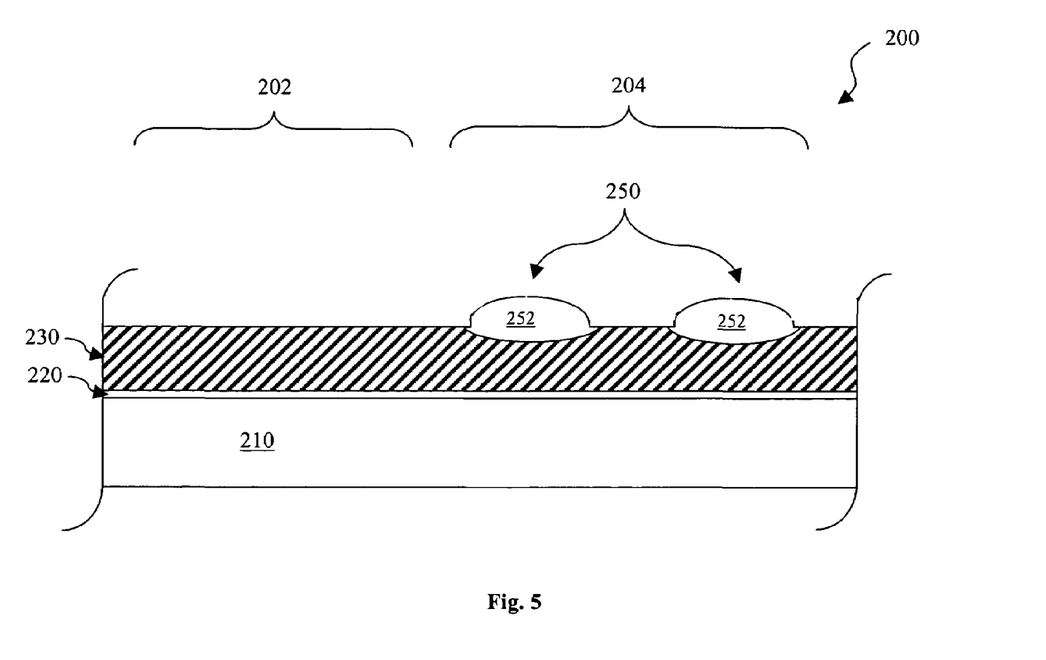

Referring to FIGS. 1 and 5, the method 100 proceeds to step 108 in which the hard mask layer 240 is removed by a suitable method such as wet etching. For example, phosphoric acid may be used if the hard mask 240 is made of silicon nitride. The alternative method to remove the hard mask layer 240 may include other wet etching, dry etching, sputtering, and reactive ion etching (RIE).

Figure 6:
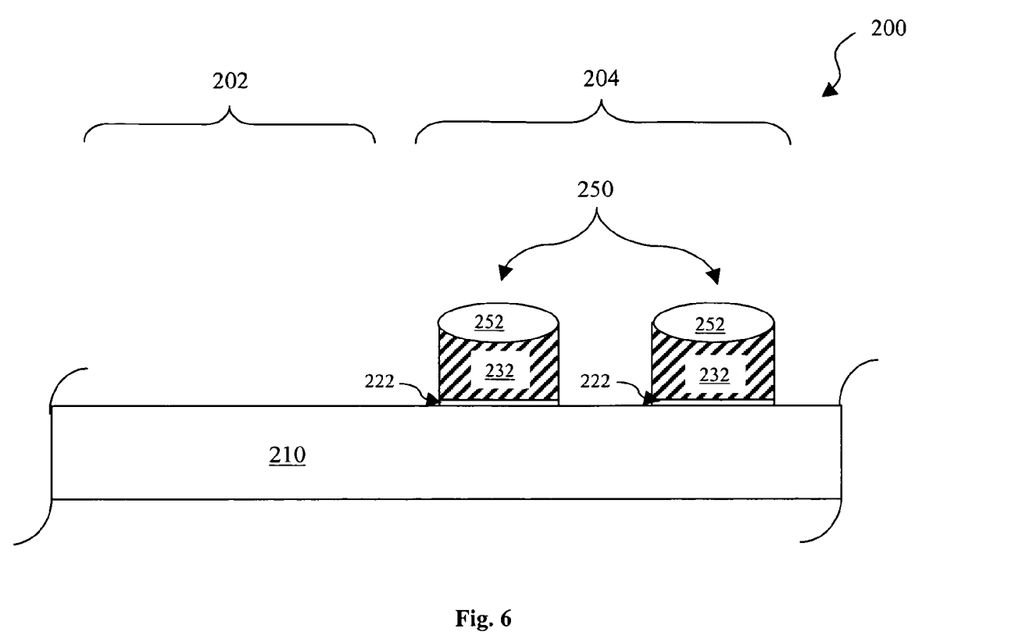

Referring to FIGS. 1 and 6, the method 100 proceeds to step 110. The polycrystalline layer 230 exposed between the plurality of poly-oxide regions 252 is removed by an etching process with, for example, a sputtering. The polycrystalline silicon underlying the poly-oxide regions 252 forms a plurality of floating gates 232 after the poly-Si etching. To ensure the etching is completed with little or no poly-Si residual (tiny footing) in the corner between the floating gate and the substrate, the etching duration can be prolonged for over etching. For example, the etching may be extended about 20% to 40% longer. The over etching process eliminates the tiny footing but may cause lateral etching to form undercuts in the polycrystalline silicon layer such that edge portions of the plurality of poly-oxide regions hang over the undercuts. The in-situ sputtering after the poly-Si etching may help to remove and eliminate the hanging-over poly-oxide edges. The in-situ sputtering may comprise an inert gas such as argon, nitrogen, helium, and/or other inert gas. In addition to the in-situ sputtering, ex-situ sputtering also can remove and eliminate the hanging-over poly-oxide edges.

The poly-Si etching process may comprise a dry etching using HBr and Cl2 as an etching gas. Alternatively, the polycrystalline silicon etching process may be achieved by performing other dry etching, wet etching, reactive ion etching (RIE), and/or sputtering. The etching gas in a dry etching may alternatively include HBr, Cl2, SF6, O2, Ar, and/or He. The etching solution in a wet etching may include HF—HNO3—H2O, and/or KOH.

The etching process may resume to remove portions of the dielectric layer 220 by different etchants, such as hydrofluoric acid, resulting in tunneling gates 222 underlying the floating gates 232. The plurality of NVM cells 250 at this stage of the present embodiment may each include a tunneling gate 222, a floating gate 232, and a poly-oxide region 252.

Figure 7:
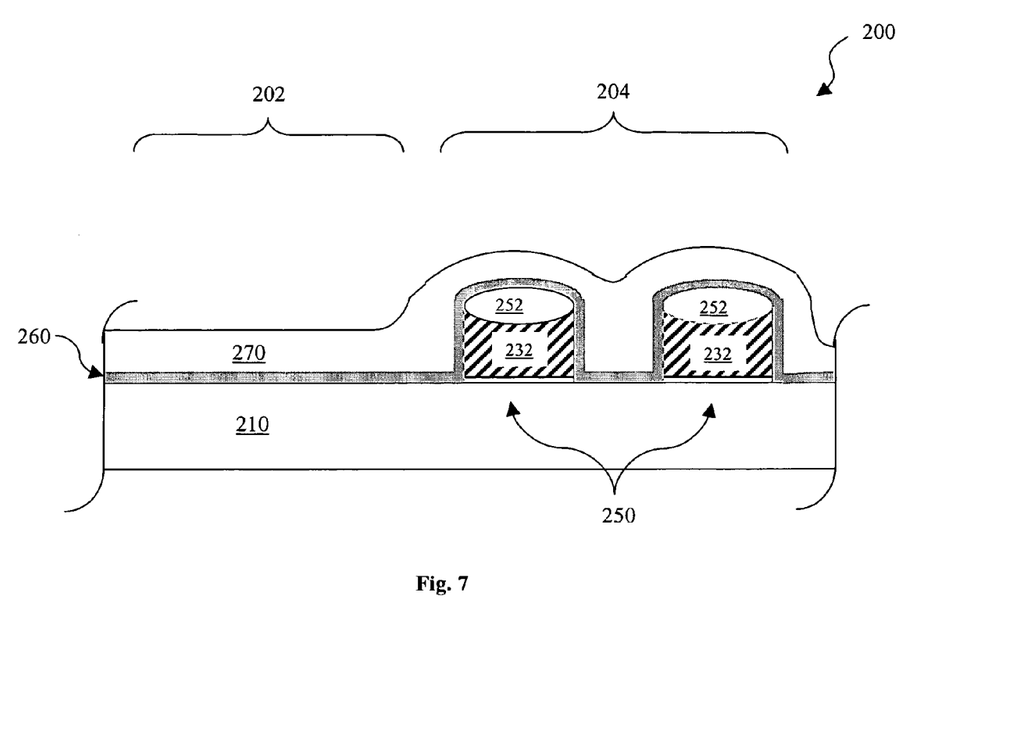

Referring to FIGS. 1 and 7, the method 100 proceeds to step 112 in which another dielectric layer 260 and then a second mask layer 270 are sequentially formed in both the cell region 204 and the peripheral region 202. The dielectric layer 260 is disposed over the poly-oxide regions and other features formed in the substrate. The dielectric layer 260 may comprise silicon oxide. The dielectric layer 260 may have a thickness ranging from about 100 angstrom to about 300 angstrom in one embodiment. The silicon oxide layer may be formed by a low pressure CVD (LPCVD) wherein dichlorosilane and nitrous oxide are reacted at a temperature ranging from about 900° C. to about 1000° C. in one example. In other embodiments, the dielectric layer 260 may comprise silicon oxide, silicon oxynitride, high-k material, or combinations thereof and may be formed using thermal oxidation, ALD, CVD, PVD, and/or other suitable methods. The high-k material may include TaN, TiN, Ta2O5, HfO2, ZrO2, HfSiON, HfSix, HfSixNy, HfAlO2, NiSix, and/or other suitable materials. The gate dielectric layer may have a multilayer structure such as one layer of silicon oxide and one layer of high-k material.

The second mask layer 270 is disposed over the dielectric layer 260 and may comprise organic material or other dielectric material. In one example, the second mask layer 270 may comprise photoresist, anti-reflective coating (ARC), and/or bottom ARC (BARC). The second mask layer 270 may have a thickness ranging from about 1200 angstrom to about 3000 angstrom.

Figure 8:
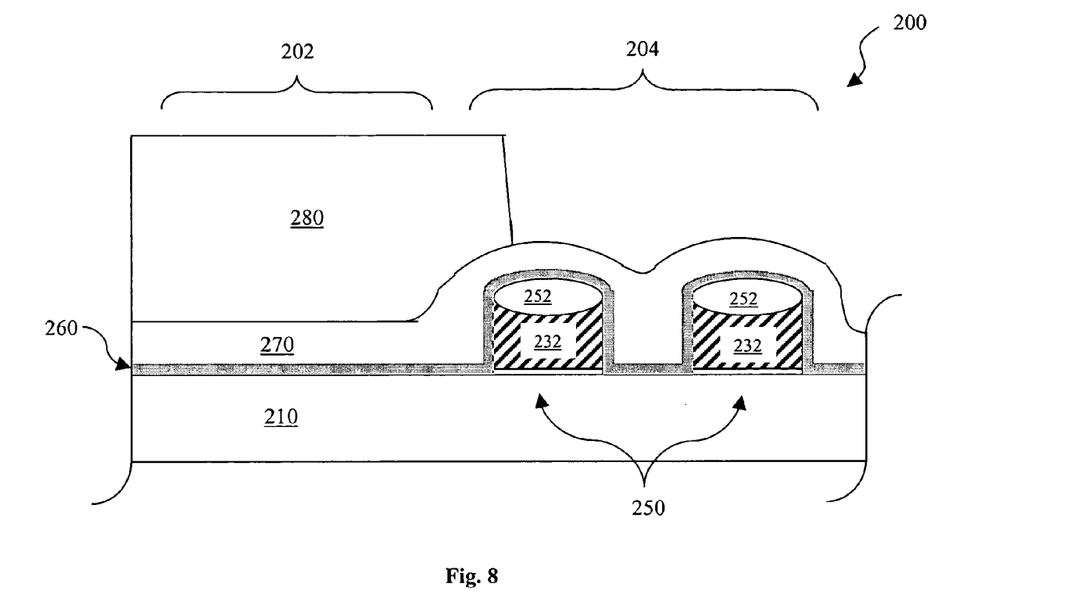

Referring to FIGS. 1 and 8, the method 100 proceeds to step 114 in which a layer of photoresist 280 is formed in the peripheral region 202. The layer of photoresist 280 may be coated by a method such as spin-on coating to a thickness ranging from about 3000 angstrom to about 15000 angstrom. Then a portion of the layer of photoresist in the cell region may then be removed by a photolithography patterning process including pre-baking, exposing, post-exposure baking, developing, and hard-baking. The layer of photoresist formed in the peripheral region could protect the second mask layer therein from removal during following etching process. Alternatively, each of the poly-oxide regions may be partially covered by the layer of photoresist such as one illustrated in FIG. 8.

Figure 9:
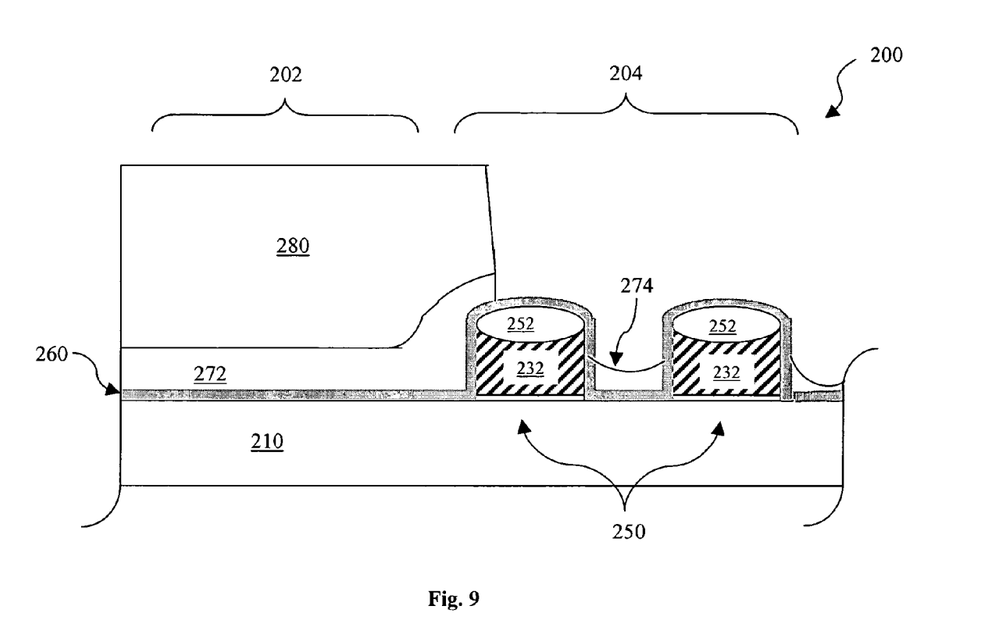

Referring to FIGS. 1 and 9, the method 100 proceeds to step 116 in which the second mask layer 270 in the cell region is etched back while the second mask layer in the peripheral region is protected from etching-back. The etching-back process may partially remove the second mask layer until the top surface of the poly-oxide regions is well exposed and the second mask layer between two memory cells has a certain thickness. For example, after the etching back, the second mask layer 272 in the peripheral region 202 is unchanged. The second mask layer over the poly-oxide regions is completely removed. The second mask layer 274 between the memory cells is substantially removed and may be reduced to a thickness ranging from about 200 angstrom to about 500 angstrom. The etching back process may be a dry etching or other proper etching process. In one example, the etching-back process may use chlorine and oxygen. The etching-back process may have a duration from about 30 seconds to about 60 seconds in one example. The etching-back process may have predefined ranges for other processing parameters including pressure, power, gas flow, and backside gas.

Figure 10:
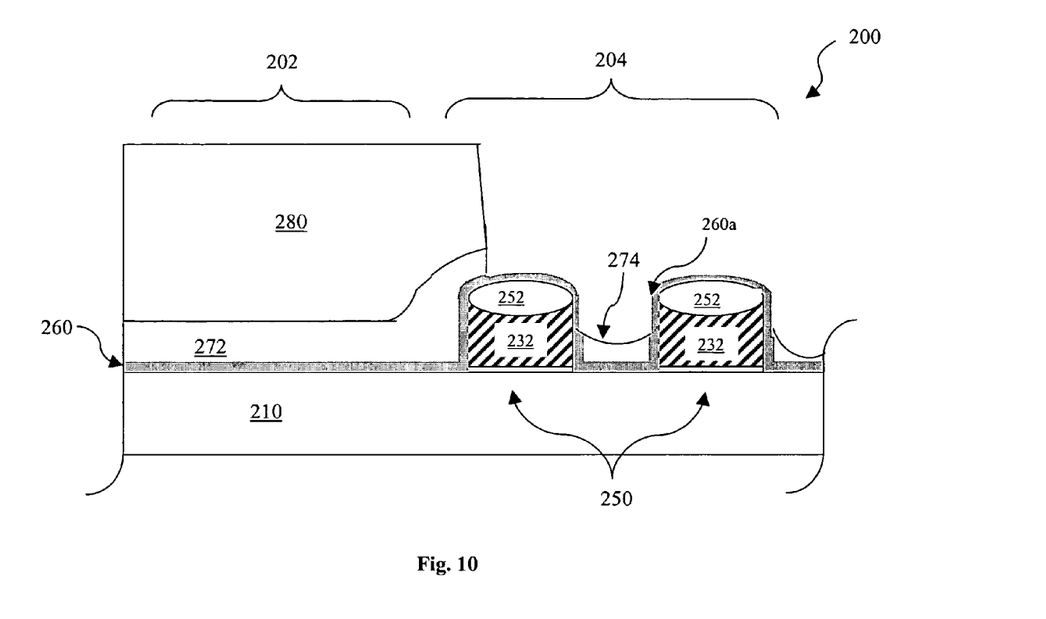

Referring to FIGS. 1 and 10, the method 100 proceeds to step 118 in which the dielectric layer 260 is partially removed. The partially removing the dielectric layer 260 can result in reduction of the thickness thereof in tip corners of the floating gates 232 to improve the erasing efficiency of the NVM cells during some operations. For example, forward tunneling voltage may be reduce without impacting the quality and reliability of the device 200 by implementing the present disclosure. In one embodiment, the dielectric layer 260 at the tip corner 260a may be thinned by an amount of 10 angstrom to about 50 angstrom. In another embodiment, a ratio of the thickness offset over the original thickness may be equal to or greater than 0.08. Since the second mask layer covers the underlying dielectric layer 260 in the peripheral region and between memory cells, the dielectric layer in these regions is well protected and remains unchanged while dielectric layer 260 at the tip corners is efficiently reduced to a lesser thickness.

The partial removal of the dielectric layer 260 may be achieved by an in-situ dry etching in the same etching tool used in etching-back the dielectric layer at step 116. The in-situ dry etching may use chlorine as an etching gas. The in-situ dry etching may have a duration from about 10 seconds to about 30 seconds in one example. The in-situ dry etching process may have predefined ranges for other processing parameters such as pressure, power, gas flow, and backside gas which may be as same as the ones set for the etching-back process. In one example, the in-situ dry etching process may be accomplished by resuming the etching back process condition but having the chlorine gas turned off for a period of time.

The partial removal of the dielectric layer 260 may alternatively be achieved by an ex-situ wet etching. The wet etching process may implement etching solution such as diluted hydrofluoric acid.

The layer of photoresist 280 may be removed either by a wet stripping or a plasma ashing between the etching back the second mask layer 270 at step 116 and the partial removal of the dielectric layer 270 at step 118 or after both steps (steps 116 and 118). For example, the layer of photoresist 280 may be removed after both steps 116 and 118 if the in-situ dry etching is implemented or may be there between if the ex-situ wet etching is implemented.

Figure 11:
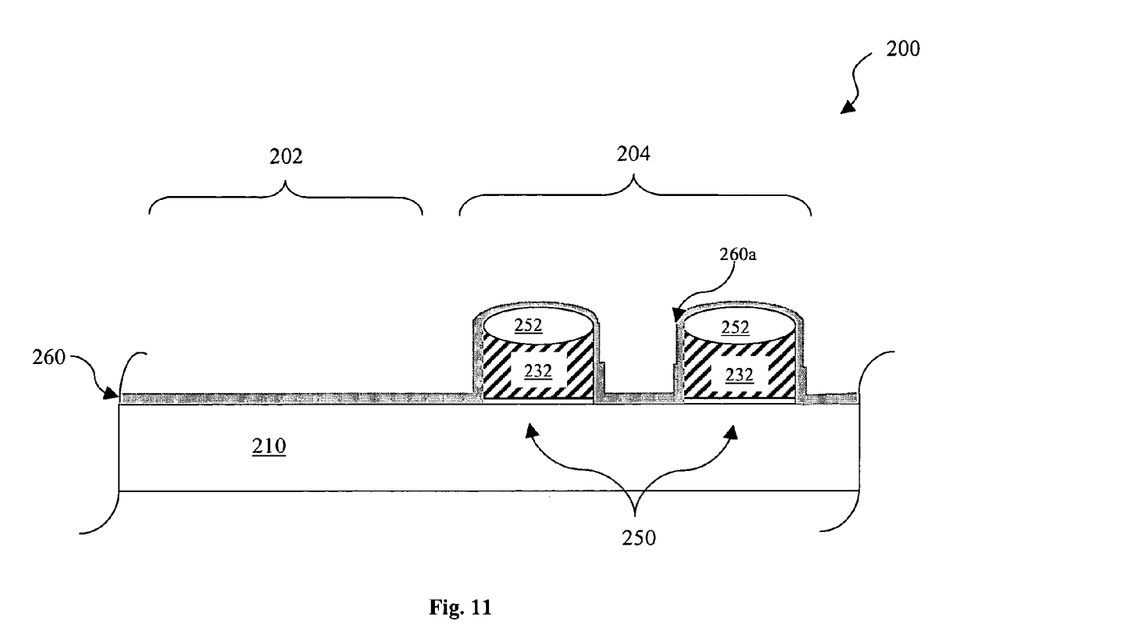

Referring to FIGS. 1 and 11, the method 100 may further proceed to step 120 in which the second mask layer 270 is removed. The second mask layer may be removed by a method such as wet etching, dry etching, sputtering, or RIE, which may be substantially similar to the method used to remove the first mask layer 240 at step 108.

Figure 12:
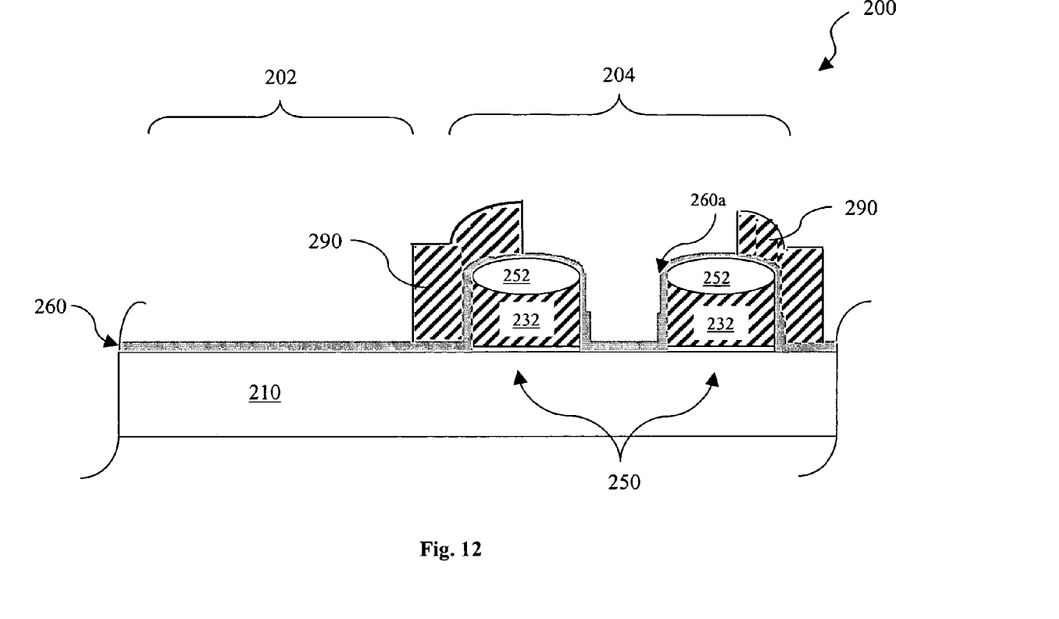

Referring to FIGS. 1 and 12, the method 100 may further proceed to step 122 in which a plurality of control gates 290 may be formed. The plurality of control gates 290 each may be disposed partially overlying one of the poly-oxide regions 252, partially overlying the sidewall of the corresponding floating gate, partially overlying the substrate, and laterally between a source/drain doped region and the floating gate. The plurality of control gates 290 may comprise polycrystalline silicon, metal, metal silicide, and/or other proper conductive material. The plurality of control gates 290 may have a multilayer structure and may be formed by CVD, PVD, plating, and/or ALD.

Referring to all the figures, the present disclosure provides a method of making embedded NVM devices. In one embodiment, the method includes forming a first mask layer overlying a polycrystalline silicon layer in a cell region and a peripheral region on a semiconductor substrate wherein the first mask layer has a plurality of openings in the cell region. Portions of the polycrystalline silicon layer exposed in the plurality of openings can be oxidized to form a plurality of poly-oxide regions, and the first mask layer can then be removed. The polycrystalline silicon layer not covered by the plurality of poly-oxide regions can be etched to form a plurality of floating gates, wherein etching the polycrystalline silicon layer is accompanied by a sputtering process. The sputtering process can be performed in-situ (e.g., sputtering in the same chamber used for the etching of polycrystalline silicon to form floating gates) or ex-situ. In-situ sputtering has an advantage of shorter cycle time and may be preferred in mass production. A dielectric layer can then be formed, as well as a second mask layer in both the cell region and the peripheral region. The second mask layer in the cell region is partially etched back after a photoresist layer is formed over the second mask layer in the peripheral region. The dielectric layer is partially etched to form multiple thicknesses of the dielectric layer. The second mask layer is removed and a plurality of control gates are formed partially overlying the plurality of floating gates in the cell region.

In some embodiments, the sputtering may comprise a gas selected from the group consisting of argon, helium, and nitrogen. The sputtering removes a portion of the plurality of poly-oxide regions hanging over undercuts in the polycrystalline silicon layer, wherein the undercuts are formed by lateral removal during etching the polycrystalline silicon layer. The etching the polycrystalline silicon layer is prolonged for over etching the polycrystalline silicon layer to eliminate tiny footing. The dielectric layer may comprise silicon oxide and may be formed by a method including chemical vapor deposition (CVD). The second mask layer may comprise organic material and/or dielectric material. In another embodiment, the second mask layer may comprise anti-reflective-coating (ARC), bottom anti-reflective-coating (BARC), and/or photoresist. The dielectric layer is thinned at a tip of each of the plurality of floating gates. The thickness of the dielectric layer at the tip of each of the plurality of floating gates may be removed off at least about 10 percentage of an original thickness thereof. The dielectric layer at the tip of each of the plurality of floating gates may be removed off about 10 angstrom to 50 angstrom thick. The partially etching the dielectric layer may be accomplished by performing hydrofluoric acid wet etching.

In another embodiment, a method of making NVM devices may comprise forming a hard mask layer having a plurality of openings over a polycrystalline silicon layer on a semiconductor substrate. Portions of the polycrystalline silicon layer exposed in the plurality of openings are oxidized to form a plurality of poly-oxide regions and the hard mask layer is removed. The polycrystalline silicon layer not covered by the plurality of poly-oxide regions is etched to form a plurality of floating gates wherein etching the polycrystalline silicon layer is accompanied by sputtering.

In yet another embodiment, a method of making a NVM device may comprise providing a semiconductor substrate having a cell region and a peripheral region wherein the cell region has a floating gate and forming a dielectric layer and then a mask layer in both the cell region and the peripheral region. A photoresist layer over the mask layer is formed in the peripheral region and the mask layer in the cell region is partially etched back while the peripheral region is covered by the photoresist layer. The dielectric layer is partially removed to form multiple thicknesses of the dielectric layer.

In still another embodiment, a method of making a NVM device may comprise providing a semiconductor substrate having a cell region and a peripheral region wherein a floating gate is disposed in the cell region. A dielectric layer is formed in both the cell region and the peripheral region and a mask layer is then formed in the peripheral region. The dielectric layer is then partially removed in the cell region.

The present disclosure also provide a semiconductor device comprising a substrate having a NVM region and a peripheral region, a floating gate disposed in the NVM region, a dielectric layer being disposed on the substrate overlying the floating gate, and a control gate disposed over the dielectric layer partially on the floating gate and partially on the substrate. The dielectric layer has a first thickness at a tip of the floating gate and a second thickness in the peripheral region, wherein a ratio of a difference between the first and second thicknesses over the second thickness is no less than 0.08.

In some embodiments, the floating gate may have a concave surface. The device may further comprise a poly-oxide feature disposed over the floating gate. The floating gate may comprise a material selected from the group consisting of polycrystalline silicon, polycrystalline silicon germanium, silicon carbide germanium, conductive material, and combinations thereof. The dielectric layer may comprises silicon oxide. The device may further comprise a gate dielectric layer interposed between the substrate and floating gate. The device may further comprise a transistor disposed in the peripheral region. The substrate of the device may comprise a material selected from the group consisting of an elementary semiconductor, a compound semiconductor, and an alloy semiconductor.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A method of making embedded non-volatile memory (NVM) devices, comprising:
    forming a first mask layer overlying a polycrystalline silicon layer in a cell region and a peripheral region on a semiconductor substrate, wherein the first mask layer includes a plurality of openings in the cell region;
    oxidizing portions of the polycrystalline silicon layer exposed in the plurality of openings to form a plurality of poly-oxide features;
    removing the first mask layer;
    etching the polycrystalline silicon layer not covered by the plurality of poly-oxide features to form a plurality of floating gates, wherein etching the polycrystalline silicon layer is accompanied by a sputtering process;
    forming a dielectric layer and then a second mask layer in both the cell region and the peripheral region;
    partially etching the second mask layer in the cell region after a layer of photoresist is formed over the second mask layer in the peripheral region;
    partially etching the dielectric layer formed in the cell region, while the second mask layer protects the peripheral region such that the dielectric layer formed in the peripheral region is not etched, whereby multiple thicknesses of the dielectric layer are formed;
    removing the second mask layer; and
    forming a plurality of control gates partially overlying and corresponding to the plurality of floating gates in the cell region.

2. The method of claim 1 wherein the sputtering comprises a gas selected from the group consisting of argon, helium, and nitrogen.

3. The method of claim 1 wherein the sputtering process utilizes a species comprising inert gas.

4. The method of claim 1 wherein forming the second mask layer comprises forming a layer of material selected from the group consisting of organic material and dielectric material.

5. The method of claim 1 wherein partially etching the dielectric layer comprises partially removing the dielectric layer at the tip of each of the plurality of floating gates at least about 10 percentage of an original thickness thereof.

6. The method of claim 1 wherein partially etching the dielectric layer comprises partially removing the dielectric layer at the tip of each of the plurality of floating gates by a thickness between about 10 angstrom and 50 angstrom.

7. The method of claim 1 wherein partially etching the dielectric layer is accomplished by wet etching or dry etching.

8. A method of making non-volatile memory (NVM) devices, comprising:
    forming a hard mask layer having a plurality of openings over a polycrystalline silicon layer on a semiconductor substrate;
    oxidizing the polycrystalline silicon layer exposed in the plurality of openings to form a plurality of poly-oxide regions;
    removing the hard mask layer; and
    etching the polycrystalline silicon layer not covered by the plurality of poly-oxide regions to form a plurality of floating gates, wherein etching the polycrystalline silicon layer is accompanied by sputtering, wherein the sputtering provides for removal of a portion of at least one of the plurality of poly-oxide regions.

9. The method of claim 8 wherein the sputtering is achieved by a gas selected from the group consisting of argon, helium, and nitrogen.

10. The method of claim 8 wherein the sputtering is achieved by a species comprising inert gas.

11. The method of claim 8 wherein the oxidization of the polycrystalline silicon layer forms the plurality of poly-oxide regions each having a convex surface.

* * * * *